United States Patent [19]

Lin

[11] Patent Number: 5,377,080

[45] Date of Patent: Dec. 27, 1994

[54] PRINTED CIRCUIT BOARD MOUNTING BOX

[76] Inventor: Chung-I Lin, 3F., No. 3, Alley 33, Lane 422, Ming-Tsu Rd., Lu-Chou Hsiang, Taipei Hsien, Taiwan, Prov. of China

[21] Appl. No.: 174,393

[22] Filed: Dec. 28, 1993

[51] Int. Cl.⁵ ............................................. H05K 5/00
[52] U.S. Cl. .................... 361/756; 206/334; 211/41; 361/730; 361/732; 361/801; 361/802
[58] Field of Search ............ 206/334, 472–474, 206/509, 511; 220/617, 669, 676, 680, 682, 685; 211/41; 361/729–732, 735, 736, 740, 790, 752, 756, 758, 796, 797, 801, 802; 439/59, 61

[56] References Cited

U.S. PATENT DOCUMENTS

| | | | |
|---|---|---|---|
| 3,316,460 | 4/1967 | Scoville | 361/796 |
| 4,261,464 | 4/1981 | Maitland | 211/41 |
| 4,261,465 | 4/1981 | Thomas | 211/41 |
| 4,585,122 | 4/1986 | Stegenga | 206/334 |
| 4,652,969 | 3/1987 | Stegenga | 361/801 |
| 4,982,847 | 1/1991 | Glover et al. | 361/802 |

FOREIGN PATENT DOCUMENTS

| | | | |
|---|---|---|---|
| 2808997 | 9/1979 | Germany | 361/740 |
| 1499536 | 8/1989 | U.S.S.R. | 361/790 |

Primary Examiner—Leo P. Picard
Assistant Examiner—Donald A. Sparks
Attorney, Agent, or Firm—Varndell Legal Group

[57] ABSTRACT

A printed circuit board mounting box includes a casing covered with a top cover, and two reversible end plates vertically disposed at two opposite ends between the top cover and casing thereof, wherein each end plate has parallel rows of horizontal T-rods at one side at different elevations for mounting printed circuit boards inside the rectangular casing horizontally; each T-rod has two grooves for mounting printed circuit boards inside the casing vertically.

4 Claims, 10 Drawing Sheets

1

PRINTED CIRCUIT BOARD MOUNTING BOX

BACKGROUND AND SUMMARY OF THE INVENTION

The present invention relates to a printed circuit board mounting box which has end plates with T-rods for mounting printed circuit boards in the longitudinal direction, and side plates with pedgs for mounting printed circuit boards in the transverse direction.

FIGS. 1 and 2 show a printed circuit board mounting box, to which the present invention pertains, which comprises a rectangular casing having two mounting grooves on two opposite ends thereof, a rectangular top cover covered on the rectangular casing at the top and having two mounting grooves on two opposite ends thereof respectively matched with the mounting grooves on the rectangular casing, and two rectangular end plates having a respective peripheral flange inserted between either mounting groove on the rectangular casing and the matched mounting groove on the rectangular top cover. This structure of printed circuit board mounting box is not satisfactory in function. One drawback of this structure of printed circuit board mounting box is that it receives fewer printed circuit boards. Another drawback of this structure of printed circuit board mounting box is that it does not allow printed circuit boards to be alternatively mounted within the casing in the horizontal and vertical positions between two end plates thereof or between two opposite lateral side walls thereof.

The present invention eliminates the aforesaid drawbacks. According to one aspect of the present invention, the printed circuit board mounting box comprises a casing covered with a top cover, and two reversible end plates vertically disposed at two opposite ends between the top cover and casing thereof, wherein each end plate has parallel rows of horizontal T-rods at one side at different elevations for mounting printed circuit boards inside the rectangular casing horizontally; each T-rod has two grooves for mounting printed circuit boards inside the casing vertically. According to another aspect of the present ivnention, the end plates may be turned through 180° angle so that several printed circuit board mounting boxes of the same structure can be connected together vertically as well as horizontally. According to still another aspect of the present invention, the printed circuit board mounting box further comprises two side plates mounted within the rectangualr casing at two opposite long sides thereof, each side plate having a plurality of horizontal pegs horizontally and vertically aligned at one side and a plurality of horizontal grooves vertically spaced at the same side for mounting printed circuit boards horizontally or vertically between the two long sides of the rectangular casing. According to still another aspect of the present invention, each side plate further comprises a plurality of pins vertically spaced at one end and a plurality of pin holes vertically spaced at an opposite end, and therefore a pluraltiy of side plates of the same structure can be connected in series by fitting the pins of one side plate into the pin holes of another.

DETAILED DESCRIPTION OF THE PREFERRED EMBODIMENT

Figure 1:
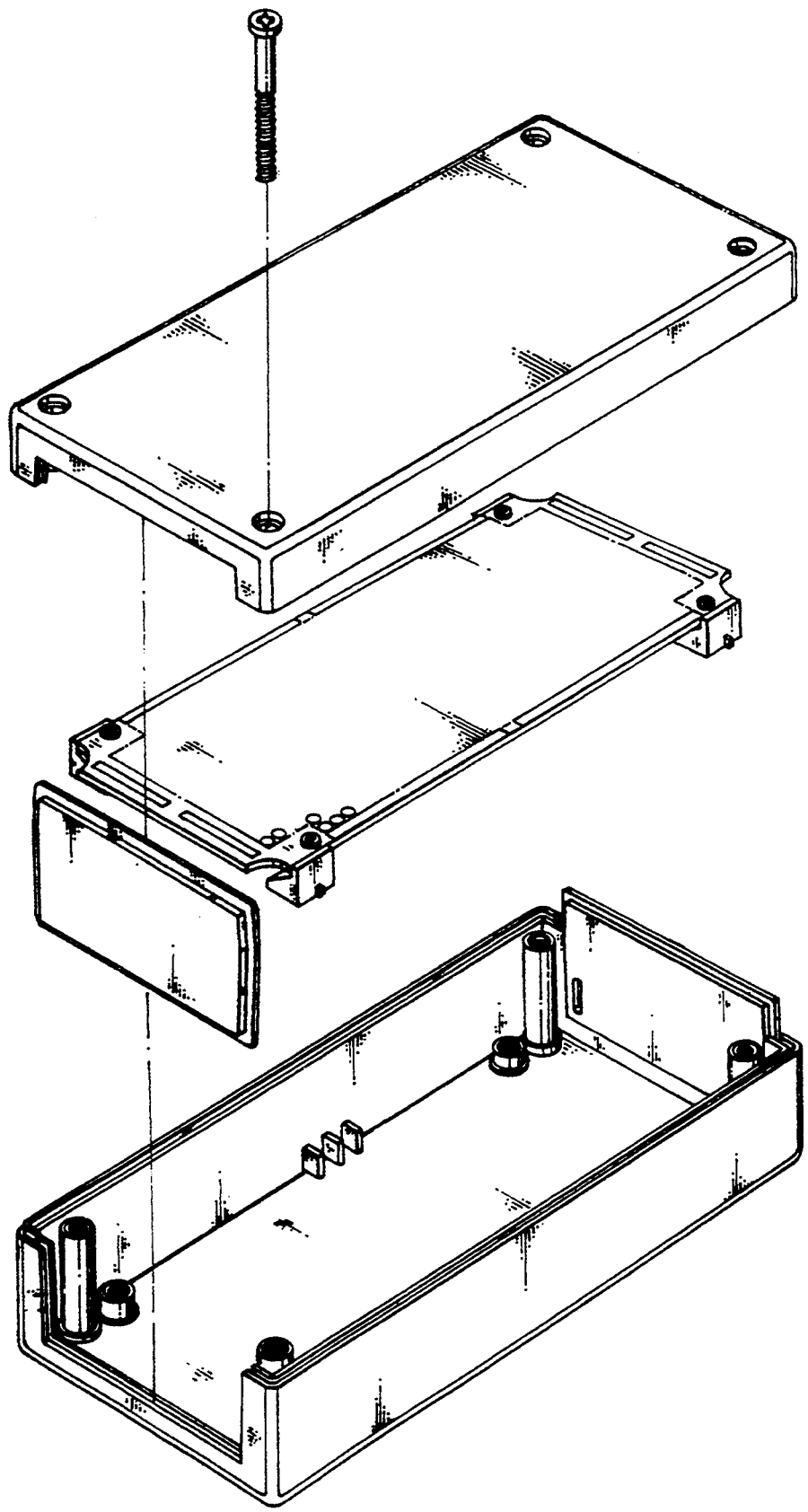
FIG. 1 is an exploded view of a printed circuit board mounting box according to the prior art.
Figure 2:
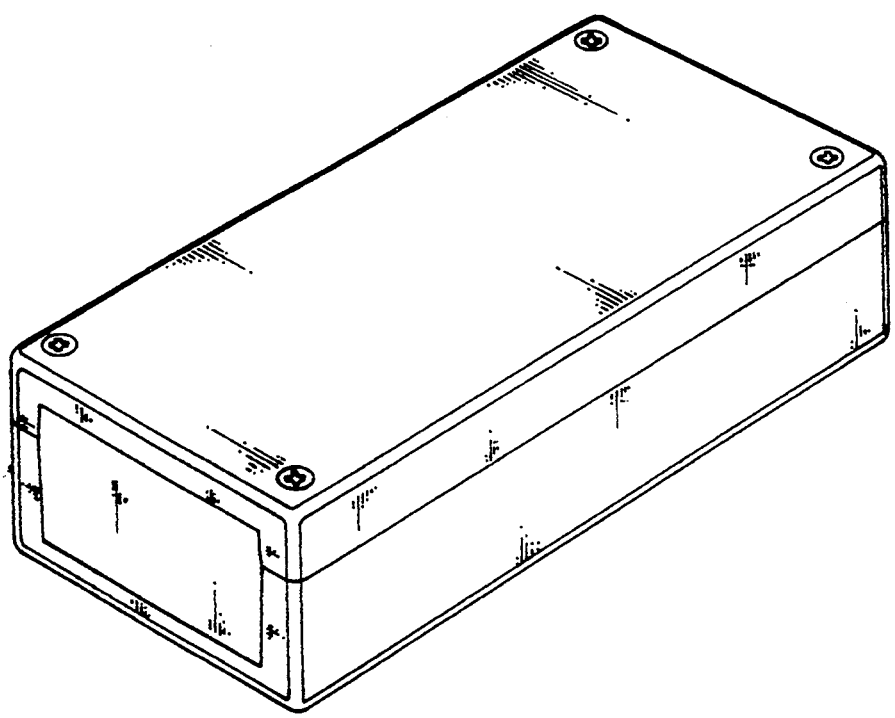
FIG. 2 is an elevational view of the printed circuit board mounting box of FIG. 1.
Figure 3:
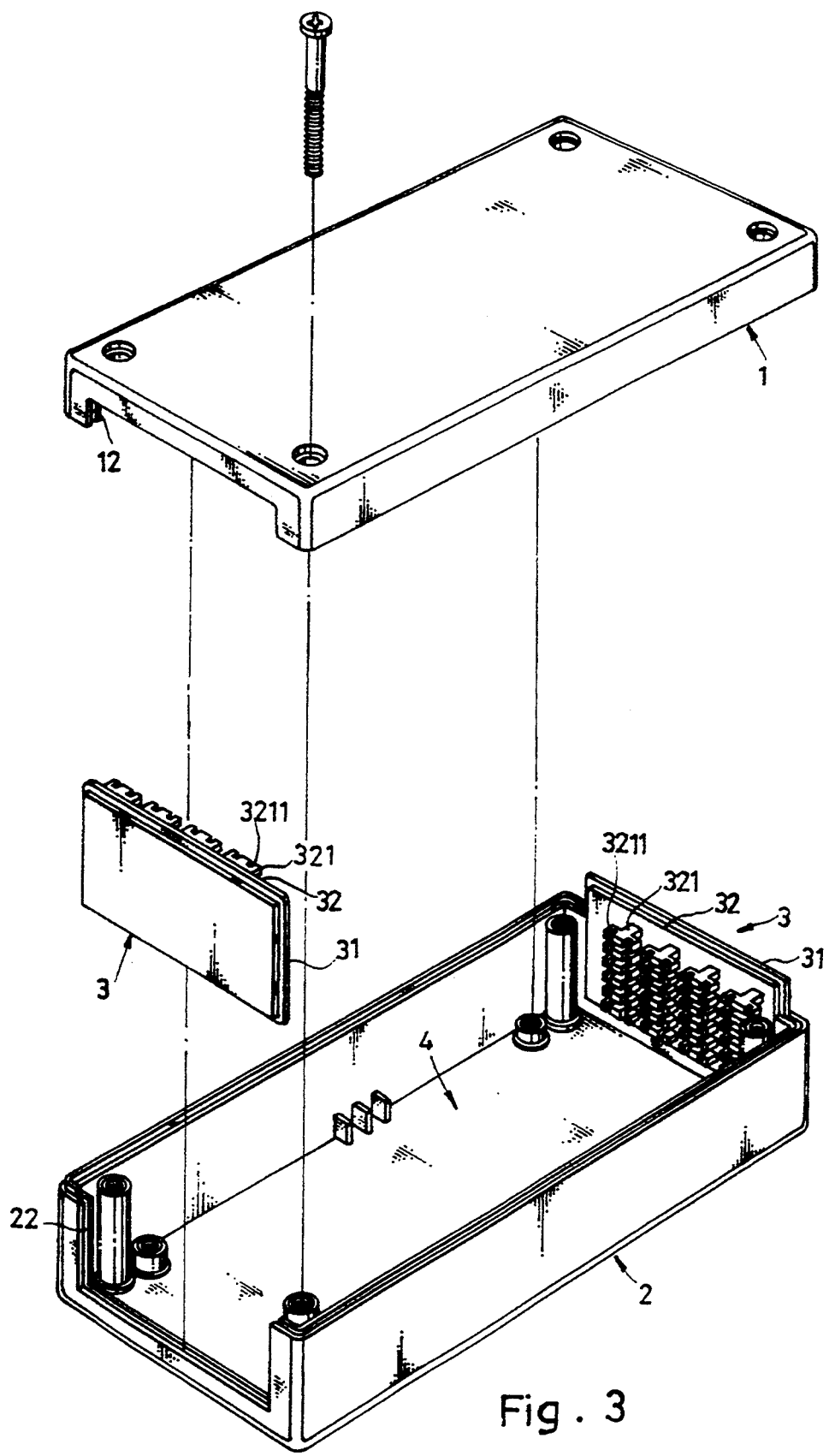
FIG. 3 is an exploded view of a printed board mounting box according to the present invention.
Figure 4:
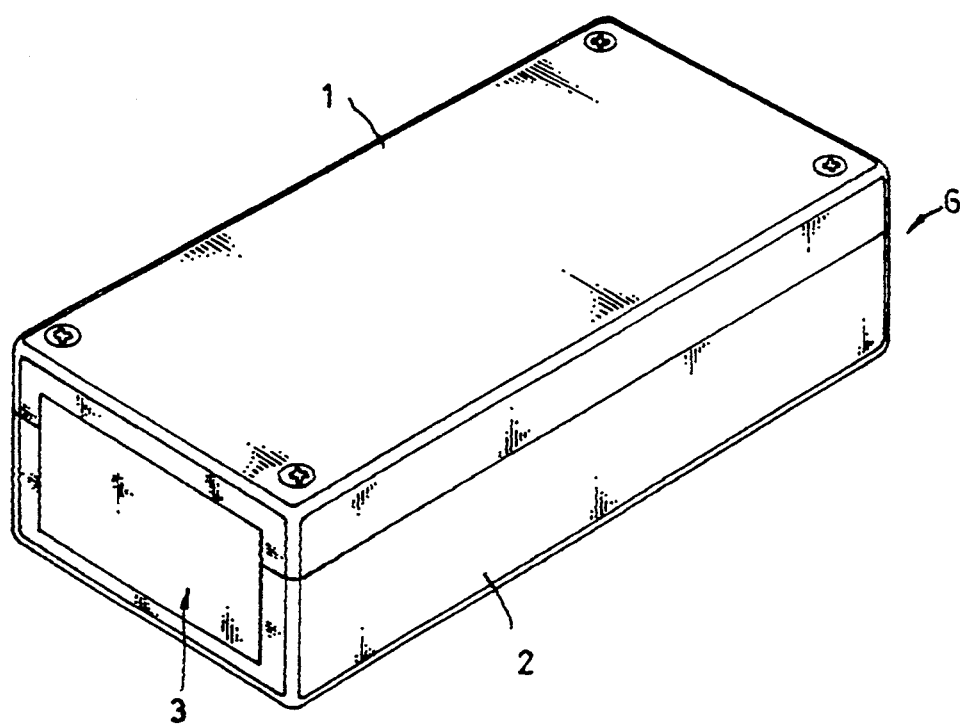
FIG. 4 is an elevational view of the printed circuit board mounting box of FIG. 3.
Figure 5:
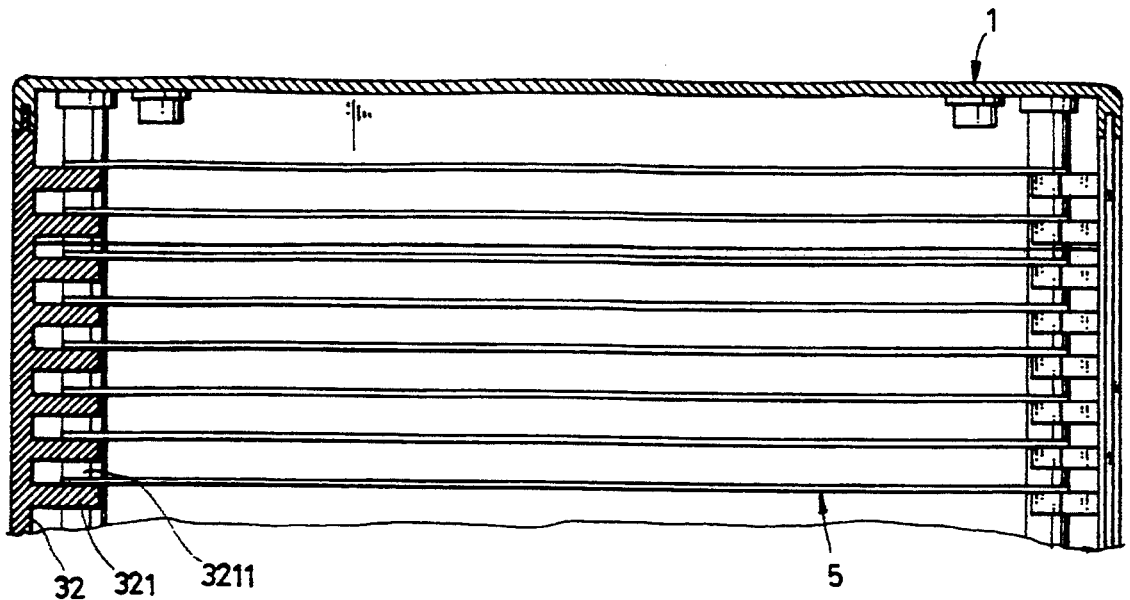
FIG. 5 is a side plain view showing printed circuit boards mounted within the casing of the printed circuit board mounting box of FIG. 3 horizontally.
Figure 6:
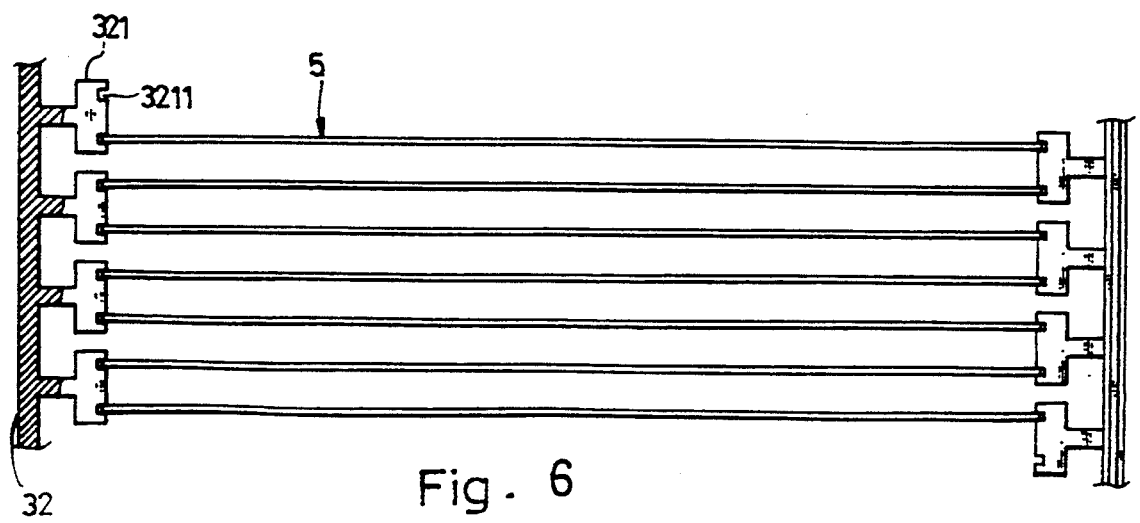
FIG. 6 is a top plain view showing printed circuit boards mounted within the casing of the printed circuit board mounting box of FIG. 3 vertically.

Referring to the annexed drawings in detail and turning now first to FIGS. 3, 4, 5 and 6, a printed circuit board mounting box 6 in accordance with present invention is generally comprised of a rectangular casing 2, a rectangular top cover 1 covered on the rectangular casing 2 at the top, two rectangular end plates 3 connected between the rectangular top cover 1 and the rectangular casing 2 at two opposite ends, and a plurality of printed circuit boards 5 mounted within the space 4 defined within the top cover 1, casing 2, and end plates 3. The top cover 1 comprises two mounting grooves 12 at two opposite ends. The casing 2 comprises two mounting grooves 22 at two opposite ends. The rectangular end plate 3 comprises a flange 31 around the border thereof inserted into the mounting grooves 12; 22 of the rectangular top cover 1 and casing 2 at one end, and parallel rows of horizontal T-rods 321 on one side wall 32 thereof at different elevations, wherein each T-rod 321 has two insertion grooves 3211, and the width of each insertion groove 3211 is approximately equal to the thickness of the printed circuit boards 5 to be mounted; the number of either row of T-rods is an odd number. The end plates 3 may be disposed in either direction permitting the T-rods 321 to be disposed inside the casing 2 or outside the casing 2. If the T-rods 321 of the end plates 3 are respectively disposed inside the casing 2, printed circuit boards 5 can be horizontally mounted within the casing 2 by inserting either end of each printed circuit board 5 into the gap between either two rows of horizontal T-rods 321 on either end plate 3 (as shown in FIG. 5). Alternatively, the printed circuit boards 5 may be vertically mounted within the casing 2 by inserting either end of each printed circuit board 5 respectively into either insertion groove 3211 on a respective T-rods 321 of every row of horizontal T-rods 321 on either end plate 3 (as shown in FIG. 6)

Figure 7:
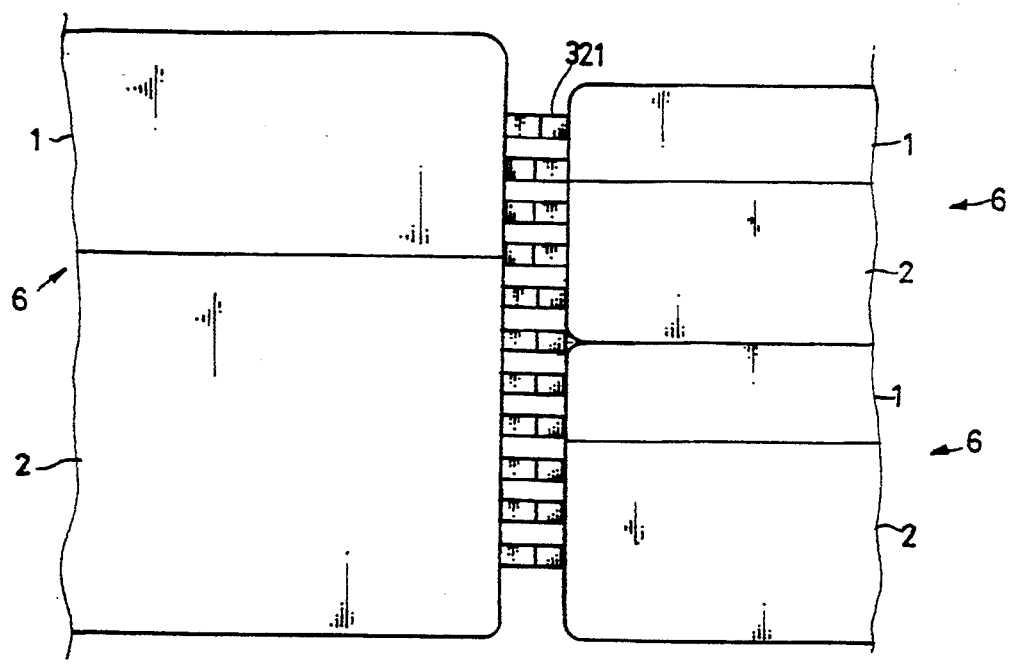
FIG. 7 shows two printed circuit board mounting boxes of the present invention linked horizontally.
Figure 8:
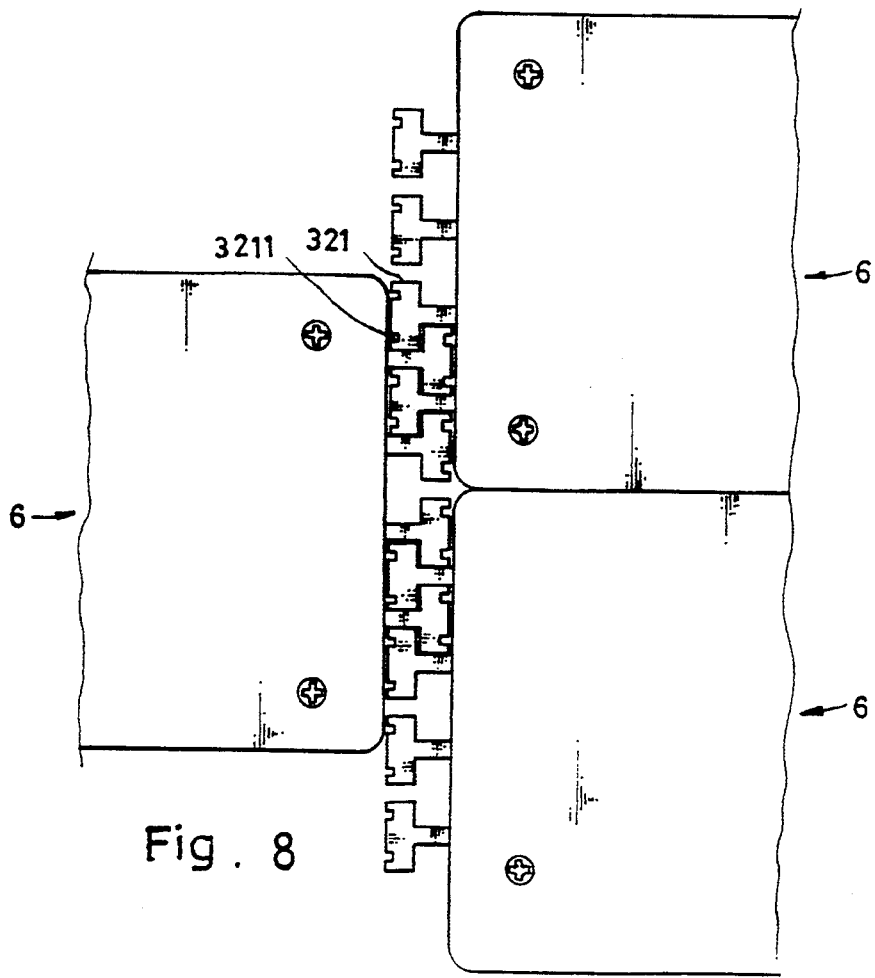
FIG. 8 shows two printed circuit board mounting boxes of the present invention linked vertically.
Figure 9:
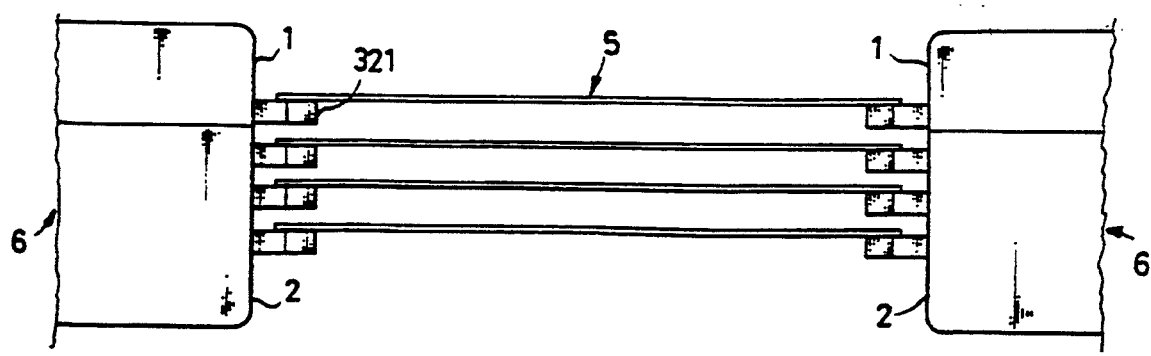
FIG. 9 shows printed circuit boards mounted between two printed circuit board mounting boxes according to the present invention.

If the T-rods 321 of the end plates 3 are respectively disposed outside the casing 2, a plurality of printed circuit board mounting boxes 6 of the same structure may be connected together horizontally (see FIG. 7) or vertically (see FIG. 8) by means of connecting the respective T-rods of one printed circuit board mounting box 6 with another. By means of the T-rods 321, printed circuit boards 5 may be horizontally mounted between two printed circuit board mounting boxes 6 of the present invention (see FIG. 9).

Figure 10:
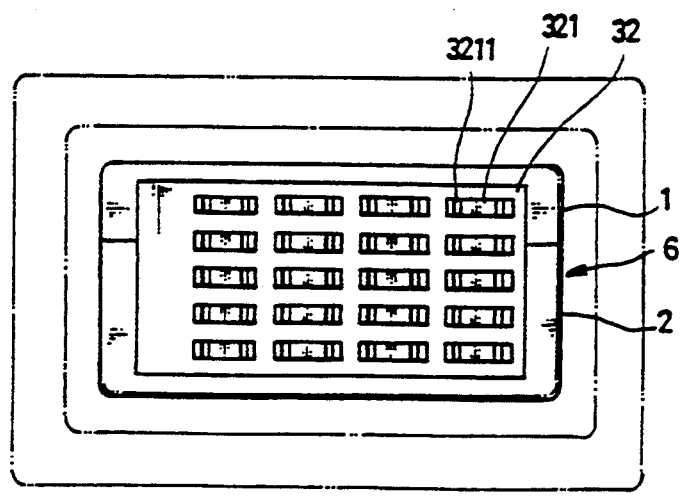
FIG. 10 shows the end plate of the present invention fitting different sizes of printed circuit board mounting boxes.

Referring to FIG. 10, the end plate 2 may be made of fit the casings of different sizes.

Figure 11:
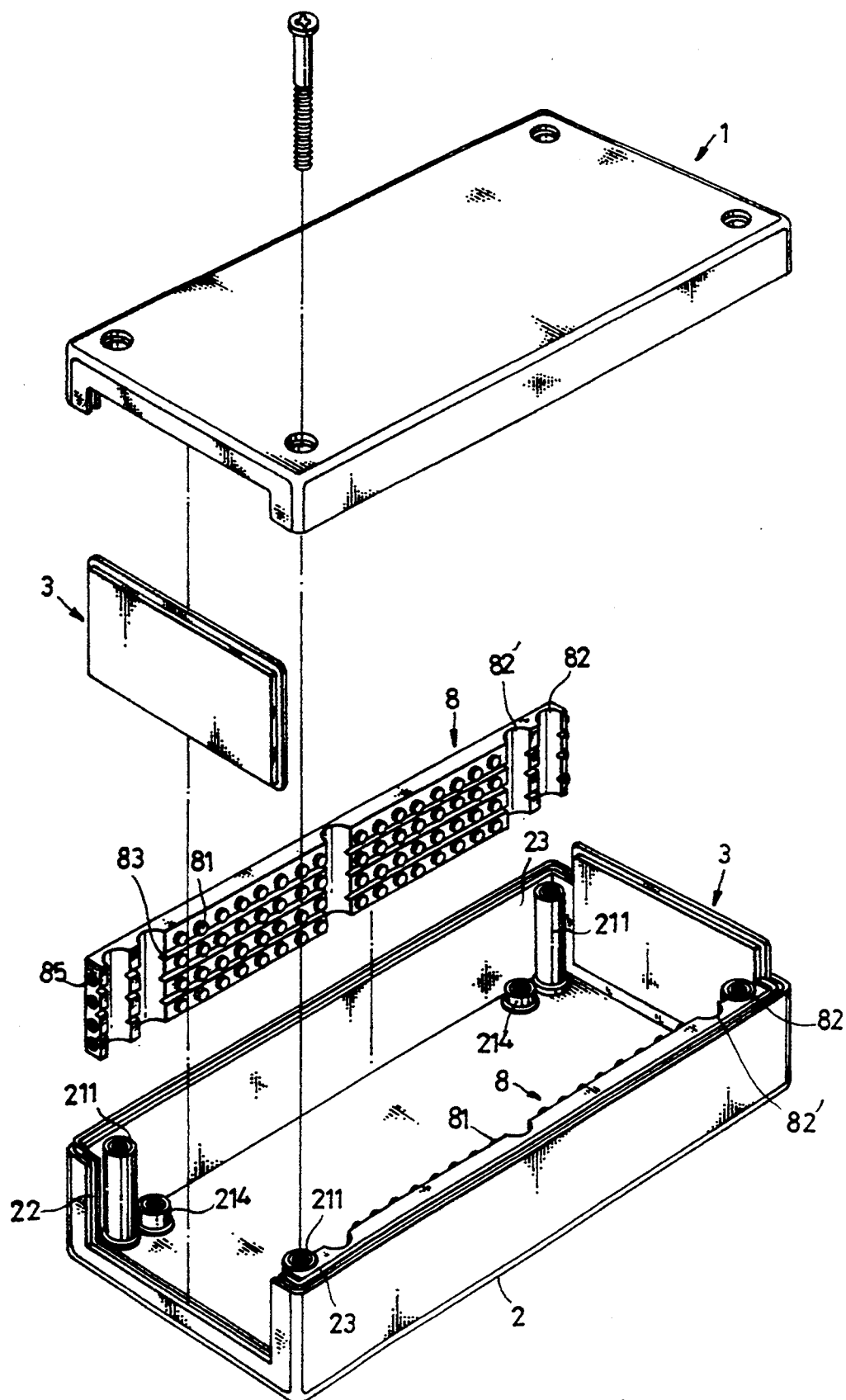
FIG. 11 is an exploded view of an alternate form of the present invention showing the installation of side plates in the casing thereof.
Figure 12:
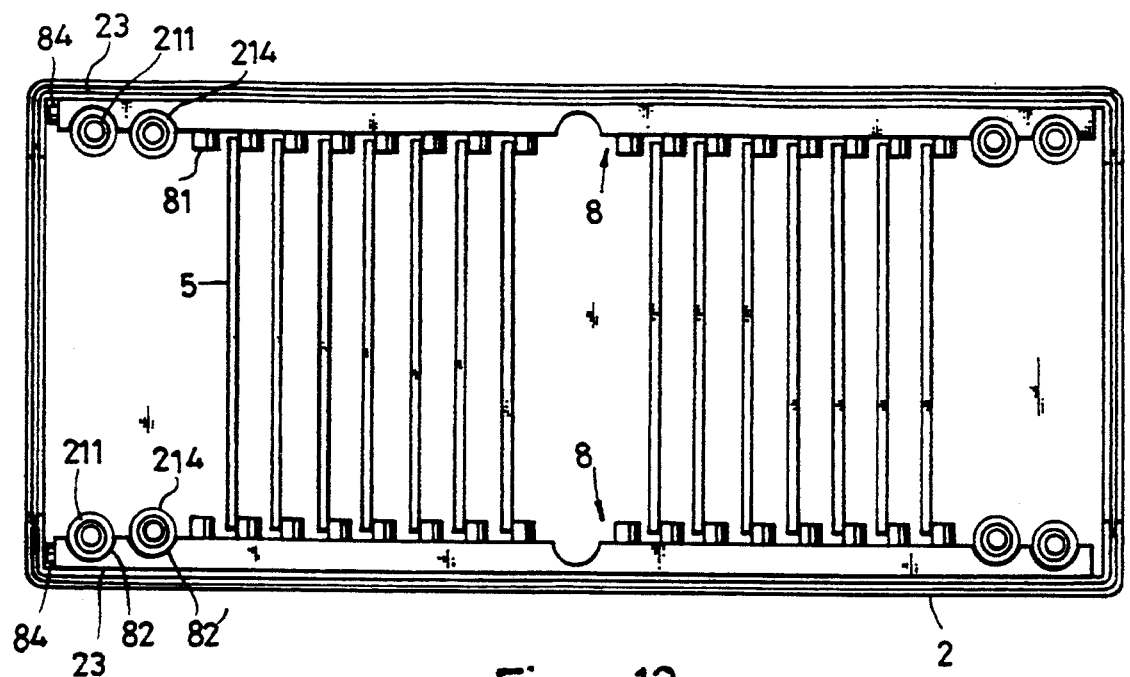
FIG. 12 is a top view of the alternate form of FIG. 11 showing printed circuit boards mounted between the side plates in the vertical direction.
Figure 13:
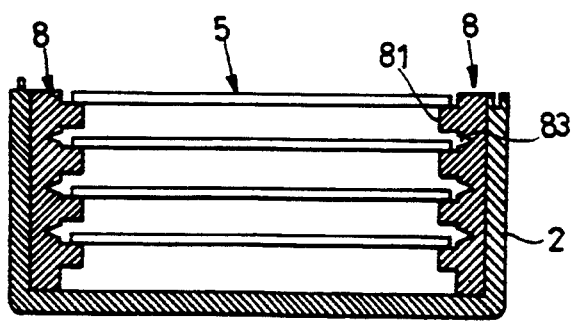
FIG. 13 is a cross section in the transverse direction of the alternate form of FIG. 11 showing printed circuit boards mounted between the side plates in the horizontal direction.

Referring to FIGS. 11, 12 and 13, two side plates 8 may be mounted within the rectangular casing 3 at two opposite lateral sides and retained between either lateral side wall 23 and respective posts 211; 214 inside the casing 3 for mounting printed circuit boards 5 in the transverse direction vertically (see FIG. 12) or horizontally (see FIG. 13). Each side plate 8 comprises a plurality of horizontal pegs 81 aligned vertically as well as horizontally on one side of the respective side plate 8, a plurality of horizontal grooves 83 vertically spaced on the same side between the pegs 81, and vertical grooves 82; 82' spaced on the same side fitting over the posts 211; 214. When printed circuit bords 5 are mounted within the rectangular casing 3 between the two side plates 8 in the vertical direction, the two opposite ends of each printed circuit board 5 are respectively inserted into the gap between either two vertically algined rows of pegs 81 (see FIG. 13); when printed circuit boards 5 are mounted within the rectangular casing 3 between the two side plates 8 in the horizontal direction, the two opposite ends of each printed circuit board 5 are respectively engaged into either horizontal grooves 83 on either side plate 8.

Figure 14:
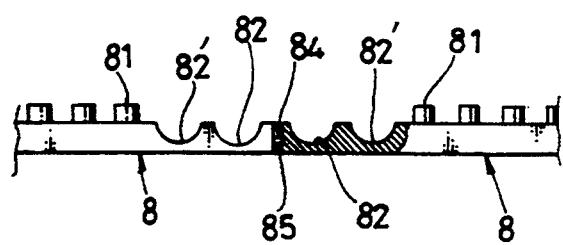
FIG. 14 shows two side plates connected in series according to the present invention.

Referring to FIG. 14 and FIG. 13 again, each side plate 8 further comprises a plurality of vertically spaced pins 85 at one end and a plurality of vertically spaced pin holes 84 at an opposite end. Therefore, a plurality of side plates 8 can be connected in series by inserting the pins 85 of one side plate 8 into the pin holes 84 on another. This arrangement makes the side plate 8 applicable for use in different casings of different sizes.

I claim:

1. A printed circuit board mounting box comprising a rectangular casing having two mounting grooves on two opposite ends thereof, a rectangular top cover provided on the rectangular casing at the top and having two mounting grooves on two opposite ends thereof respectively matched with the mounting grooves on said rectangular casing, and two rectangular end plates having a respective peripheral flange inserted between either mounting groove on said rectangular casing and the matched mounting groove on said rectangular top cover, wherein each end plate comprises parallel rows of horizontal T-rods at one side at different elevations for mounting printed circuit boards inside said rectangular casing between said two end plates horizontally; said end plates can be fastened between said rectangular top cover and said rectangular casing at two opposite ends in either direction permitting the respective T-rods to be disposed inside or outside said rectangular casing alternatively.

2. The printed circuit board mounting box of claim 1 wherein each T-rod has two insertion grooves, the width of each insertion groove being approximately equal to the thickness of the printed circuit boards to be mounted for permitting the printed circuit boards to be vertically mounted inside said casing between said two end plates.

3. The printed circuit board mounting box of claim 1 further comprising two side plates mounted within said rectangular casing at two opposite long sides thereof, each side plate comprising a plurality of horizontal pegs horizontally and vertically aligned at one side and a plurality of horizontal grooves vertically spaced at the same side for mounting printed circuit boards horizontally or vertically between the two long sides of said rectangular casing.

4. The printed circuit board mounting box of claim 3 wherein each side plate further comprises a plurality of pins vertically spaced at one end and a plurality of pin holes vertically spaced at an opposite end, the pins of one side plate being for pluggable receipt into the pin holes on another plate of the same structure.

* * * * *